United States Patent
Koezuka (10) Patent No.: US 9,136,141 B2
(45) Date of Patent: Sep. 15, 2015

(54) METHOD FOR MANUFACTURING SEMICONDUCTOR SUBSTRATE

(75) Inventor: Junichi Koezuka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 590 days.

(21) Appl. No.: 13/192,498

(22) Filed: Jul. 28, 2011

(65) Prior Publication Data

US 2012/0034758 A1    Feb. 9, 2012

(30) Foreign Application Priority Data

Aug. 5, 2010  (JP) ................. 2010-176013

(51) Int. Cl.
*H01L 21/762* (2006.01)
*H01L 21/324* (2006.01)
*H01L 21/84* (2006.01)

(52) U.S. Cl.
CPC ........ *H01L 21/324* (2013.01); *H01L 21/76254* (2013.01); *H01L 21/84* (2013.01)

(58) Field of Classification Search
CPC ................... H01L 21/76251; H01L 21/76254; H01L 21/76259; H01L 21/324
USPC ................... 438/458; 257/E21.568, E21.569, 257/E21.57
See application file for complete search history.

(56) References Cited

U.S. PATENT DOCUMENTS

| | | | |
|---|---|---|---|
| 6,020,252 A | 2/2000 | Aspar et al. | |
| 6,225,192 B1 | 5/2001 | Aspar et al. | |
| 6,372,609 B1 | 4/2002 | Aga et al. | |
| 6,534,380 B1 | 3/2003 | Yamauchi et al. | |
| 6,583,440 B2 | 6/2003 | Yasukawa | |
| 6,809,009 B2 | 10/2004 | Aspar et al. | |
| 6,818,921 B2 | 11/2004 | Yasukawa | |
| 7,064,049 B2 | 6/2006 | Ito et al. | |
| 7,067,396 B2 | 6/2006 | Aspar et al. | |
| 7,112,514 B2 | 9/2006 | Yasukawa | |
| 7,119,365 B2 | 10/2006 | Takafuji et al. | |
| 7,148,124 B1 | 12/2006 | Usenko | |
| 7,446,019 B2 | 11/2008 | Daval et al. | |
| 7,449,395 B2 | 11/2008 | Allibert et al. | |
| 7,498,234 B2 | 3/2009 | Aspar et al. | |
| 7,619,250 B2 | 11/2009 | Takafuji et al. | |
| 7,638,408 B2 * | 12/2009 | Yamazaki et al. | 438/406 |
| 7,696,058 B2 | 4/2010 | Kakehata et al. | |
| 7,763,502 B2 | 7/2010 | Kakehata et al. | |

(Continued)

FOREIGN PATENT DOCUMENTS

| JP | 10-050628 A | 2/1998 |
|---|---|---|
| JP | 11-233449 A | 8/1999 |

(Continued)

*Primary Examiner* — Stephen W Smoot
*Assistant Examiner* — Sun M Kim
(74) *Attorney, Agent, or Firm* — Eric J. Robinson; Robinson Intellectual Property Law Office, P.C.

(57) ABSTRACT

A cap film which can prevent diffusion of hydrogen from the embrittled region and supply hydrogen to a region between the embrittled region and the surface of the semiconductor substrate is formed over the semiconductor substrate, and the semiconductor layer is transferred from the semiconductor substrate to the base substrate. In particular, the amount of hydrogen contained in the cap film formed over the semiconductor substrate is preferably greater than or equal to the irradiation amount of hydrogen ions.

22 Claims, 5 Drawing Sheets

(56) References Cited

U.S. PATENT DOCUMENTS

| | | |
|---|---|---|
| 7,829,432 B2 | 11/2010 | Ohnuma et al. |
| 7,867,873 B2 | 1/2011 | Murakami et al. |
| 7,951,689 B2 | 5/2011 | Akimoto et al. |
| 7,989,305 B2 | 8/2011 | Ohnuma et al. |
| 8,101,503 B2 | 1/2012 | Aspar et al. |
| 8,409,966 B2 | 4/2013 | Ohnuma et al. |
| 2008/0283916 A1* | 11/2008 | Yamazaki .................... 257/347 |
| 2008/0308897 A1* | 12/2008 | Kakehata et al. ..... 257/E21.704 |
| 2009/0023267 A1 | 1/2009 | Daval et al. |
| 2009/0079024 A1 | 3/2009 | Yamazaki |
| 2009/0098704 A1* | 4/2009 | Ohnuma et al. ...... 257/E21.567 |
| 2009/0098739 A1 | 4/2009 | Ohnuma et al. |
| 2010/0120225 A1* | 5/2010 | Kakehata et al. ............ 438/458 |
| 2011/0039395 A1 | 2/2011 | Ohnuma et al. |
| 2011/0263096 A1 | 10/2011 | Ohnuma et al. |
| 2012/0133028 A1 | 5/2012 | Aspar et al. |

FOREIGN PATENT DOCUMENTS

| | | |
|---|---|---|
| JP | 2000-124092 | 4/2000 |
| JP | 2002-170942 | 6/2002 |
| JP | 2009-111362 A | 5/2009 |

* cited by examiner

METHOD FOR MANUFACTURING SEMICONDUCTOR SUBSTRATE

BACKGROUND OF THE INVENTION

1. Field of the Invention

An embodiment of the present invention relates to a method for manufacturing a substrate in which a semiconductor layer is provided over an insulating layer. In addition, an embodiment of the present invention relates to a method for manufacturing a semiconductor device by using a substrate in which a semiconductor layer is provided over an insulating layer.

2. Description of the Related Art

In recent years, an integrated circuit using an SOI (silicon on insulator) substrate in which a thin single crystal semiconductor layer is formed over an insulating surface, instead of a bulk silicon wafer, has been developed. With the use of an SOI substrate, parasitic capacitance between a drain of a transistor and a substrate can be reduced; thus, an SOI substrates is attracting attention for its ability to improve performance of a semiconductor integrated circuit.

One of known methods for manufacturing an SOI substrate is a hydrogen ion implantation separation method (for example, see Patent Document 1). A summary of a method for manufacturing an SOI substrate by a hydrogen ion implantation separation method is as follows. First, hydrogen ions are implanted into a silicon wafer by an ion implantation method to form a microbubble layer at a predetermined depth from a surface. Next, the silicon wafer into which hydrogen ions have been implanted is bonded to another silicon wafer with a silicon oxide film interposed therebetween. Then, heat treatment is performed. The microbubble layer serves as a cleavage plane and part of the silicon wafer into which hydrogen ions have been implanted is separated into a thin film shape along the microbubble layer. Accordingly, a single crystal silicon film can be formed over the other silicon wafer to which the silicon wafer into which hydrogen ions have been implanted is bonded.

In addition, a method for forming a single crystal silicon film over a base substrate made of glass by using such a hydrogen ion implantation separation method as described above has been proposed (for example, see Patent Document 2). Since a glass substrate can have a larger area and is less expensive than a silicon wafer, by using a glass substrate as a base substrate, an inexpensive large-sized SOI substrate can be manufactured.

Further, in Patent Document 2, it is disclosed that a silicon nitride film is provided between the base substrate and the single crystal silicon film so as to prevent impurities or the like contained in the base substrate from being diffused to the single crystal silicon film.

A single crystal semiconductor substrate is irradiated with accelerated hydrogen ions, whereby implantation of the hydrogen ions or doping with the hydrogen ions is performed on part of the single crystal semiconductor substrate at a predetermined depth to form an embrittled region there. Then, heat treatment is performed. Through the heat treatment, hydrogen contained in the embrittled region is vaporized and further the hydrogen is expanded, so that a cleavage plane is formed in the embrittled region.

REFERENCE

Patent Document

[Patent Document 1] Japanese Published Patent Application No. 2000-124092

[Patent Document 2] Japanese Published Patent Application No. 2002-170942

SUMMARY OF THE INVENTION

In a step of transferring a semiconductor layer to a base substrate, heat treatment is performed on a semiconductor crystalline substrate in which an embrittled region is formed, so that hydrogen contained in the embrittled region is vaporized and further expanded to form a cleavage plane in the embrittled region. Since such a mechanism is used, heat treatment in the transfer step is essential.

However, in the case of using a glass substrate as the base substrate, it is necessary that the highest temperature in the transfer step be lower than the strain point of a glass substrate.

In view of the above, a method in which the temperature of heat treatment is lowered has been researched and developed. One example is a method in which the irradiation amount of accelerated hydrogen ions is increased to increase the implantation amount or the doping amount of hydrogen ions into an embrittled region. However, when the implantation amount or the doping amount of hydrogen ions is increased, the following three problems arise.

First, damage such as a stacking fault or dislocation caused in a semiconductor layer is increased; and it is difficult to repair the damage after the semiconductor layer is transferred. Consequently, characteristics of a semiconductor element such as a transistor manufactured using the semiconductor layer are poor owing to the damage.

Second, a phenomenon called blistering in which a semiconductor layer partly swells is likely to be caused in a manufacturing process. Occurrence of blistering results in formation of many defects in a semiconductor layer that is transferred. Further, occurrence of blistering makes it difficult to bond a semiconductor layer to a substrate and to transfer a semiconductor layer.

Third, time for irradiation with hydrogen ions gets long, which reduces production efficiency. In particular, a hydrogen ion implantation apparatus or doping apparatus is large and expensive; therefore, when process time (cycle time) gets long, economic loss is large.

The present invention has been made in view of the foregoing technical background. Therefore, an object is to provide a method for manufacturing an SOI substrate, in which a semiconductor layer can be transferred from a semiconductor substrate to a base substrate at low heat treatment temperature without increasing the irradiation amount of accelerated hydrogen ions.

Another object is to provide an SOI substrate including a semiconductor film with a small number of crystal defects.

Another object is to provide a method for manufacturing, with high yield, an SOI substrate in which unevenness due to blistering or the like is reduced.

Another object is to provide a method for manufacturing an SOI substrate, in which time for irradiation with hydrogen ions is short.

In order to achieve the above object, attention has been focused on hydrogen which does not contribute to cleavage and is diffused from an embrittled region to a surface of a semiconductor substrate, which is on the base substrate side. Then, the invention has been made, in which a cap film that can prevent diffusion of hydrogen from the embrittled region and supply hydrogen to a region between the embrittled region and the surface of the semiconductor substrate is formed over the semiconductor substrate, and a semiconductor layer is transferred from the semiconductor substrate to the base substrate. In particular, the hydrogen concentration of the cap film formed over the semiconductor substrate is preferably greater than or equal to the irradiation amount of hydrogen ions.

Hydrogen in the embrittled region is diffused to a region where the hydrogen concentration is low through heat treatment. In particular, since the distance from the embrittled region to the surface of the semiconductor substrate is as short as greater than or equal to 10 nm and less than or equal to 500 nm (preferably greater than or equal to 50 nm and less than or equal to 200 nm), part of hydrogen in the embrittled region is dissipated from the surface of the semiconductor substrate without contributing to cleavage. Therefore, a cap film may be provided over the surface of the semiconductor substrate, which is close to the embrittled region, to suppress dissipation of hydrogen from the substrate surface, so that the hydrogen concentration of the embrittled region during the heat treatment may be maintained.

In particular, by setting the hydrogen concentration of the cap film to be greater than or equal to the irradiation amount of hydrogen ions, the cap film serves as a hydrogen supply source. By providing the cap film serving as a hydrogen supply source, hydrogen is diffused from the cap film to the embrittled region through the surface of the semiconductor substrate during the heat treatment, whereby the hydrogen concentration from the cap film to the embrittled region can be increased. Consequently, the phenomenon in which hydrogen is diffused from the embrittled region to the surface side of the semiconductor substrate can be suppressed, so that the hydrogen concentration of the embrittled region can be maintained.

The irradiation amount of accelerated hydrogen ions is set to greater than or equal to $5\times10^{20}$ atoms/cm$^3$ and less than or equal to $3\times10^{21}$ atoms/cm$^3$, preferably greater than or equal to $8\times10^{20}$ atoms/cm$^3$ and less than or equal to $2\times10^{21}$ atoms/cm$^3$, more preferably greater than or equal to $1\times10^{21}$ atoms/cm$^3$ and less than to $2\times10^{21}$ atoms/cm$^3$, whereby the embrittled region can be formed. Moreover, by performing the heat treatment, hydrogen in the embrittled region can be vaporized and expanded to form a cleavage plane.

The cleavage plane may be formed in the embrittled region effectively by the heat treatment followed by vaporization and expansion of hydrogen while maintaining the hydrogen concentration of the embrittled region with the above action.

According to an embodiment of the present invention, a method for manufacturing an SOI substrate includes the steps of: forming an embrittled region by irradiating one surface of a semiconductor substrate with accelerated hydrogen ions, forming a cap film having the hydrogen concentration greater than or equal to an irradiation amount of the hydrogen ions over the one surface of the semiconductor substrate, bonding the semiconductor substrate in which the embrittled region is formed to a base substrate with the cap film interposed therebetween, and separating a semiconductor layer along the embrittled region in the semiconductor substrate by performing heat treatment, thereby forming the semiconductor layer over a surface of the base substrate.

According to the above embodiment of the present invention, with the cap film provided over the surface of the semiconductor substrate, a phenomenon in which hydrogen is dissipated from the semiconductor substrate by the heat treatment can be suppressed and the hydrogen concentration of the embrittled region can be maintained, so that the irradiation amount of accelerated hydrogen ions can be reduced. In particular, hydrogen concentration of the cap film is greater than or equal to the irradiation amount of hydrogen ions can effectively serve as a hydrogen supply source, so that distribution of hydrogen from the embrittled region can be suppressed.

Consequently, a cleavage plane can be formed effectively in the embrittled region. Thus, even when the irradiation amount of hydrogen ions is small, the semiconductor layer can be transferred from the semiconductor substrate to the base substrate at low heat treatment temperature.

According to another embodiment of the present invention, a method for manufacturing an SOI substrate includes the steps of: forming an embrittled region by irradiating one surface of a semiconductor substrate with accelerated hydrogen ions, forming a cap film having the hydrogen concentration greater than or equal to an irradiation amount of the hydrogen ions over the one surface of the semiconductor substrate, preheating the semiconductor substrate over which the cap film is formed and in which the embrittled region is formed, bonding the semiconductor substrate in which the embrittled region is formed to a base substrate with the cap film interposed therebetween, and separating a semiconductor layer along the embrittled region in the semiconductor substrate by performing heat treatment, thereby forming the semiconductor layer over a surface of the base substrate.

According to the above embodiment of the present invention, with the cap film provided over the surface of the semiconductor substrate, a phenomenon in which hydrogen is dissipated from the semiconductor substrate and diffused from the embrittled region by the heat treatment can be suppressed and the hydrogen concentration of the embrittled region can be maintained, so that the irradiation amount of accelerated hydrogen ions can be reduced. In particular, the cap film which has the hydrogen concentration greater than or equal to the irradiation amount of hydrogen ions can effectively serve as a hydrogen supply source, so that diffusion of hydrogen from the embrittled region can be suppressed.

When preheating treatment is performed on the semiconductor substrate over which the cap film is formed, thermal budget (heat history) and/or heating unevenness due to an uneven glass substrate can be suppressed.

Consequently, a cleavage plane can be formed effectively in the embrittled region. Thus, even when the irradiation amount of hydrogen ions is small, the semiconductor layer can be transferred from the semiconductor substrate to the base substrate at low heat treatment temperature.

According to another embodiment of the present invention, in the method for manufacturing an SOI substrate, the irradiation amount of the accelerated hydrogen ions is greater than or equal to $5\times10^{20}$ atoms/cm$^3$ and less than or equal to $3\times10^{21}$ atoms/cm$^3$.

According to the above embodiment of the present invention, even when the irradiation amount of the hydrogen ions is small, the semiconductor layer can be transferred from the semiconductor substrate to the base substrate at low heat treatment temperature. Moreover, the irradiation amount of the hydrogen ions is reduced, so that the process time (cycle time) can be shortened.

According to another embodiment of the present invention, in the method for manufacturing an SOI substrate, the step of irradiating the semiconductor substrate with the accelerated hydrogen ions to form the embrittled region in the semiconductor substrate is performed after the step of forming the cap film over the semiconductor substrate.

According to the above embodiment of the present invention, when knock-on is caused by implanted hydrogen, hydrogen in the cap film moves in the depth direction, which increases the hydrogen concentration of the embrittled region, so that the embrittled region can be formed effectively.

According to another embodiment of the present invention, in the method for manufacturing an SOI substrate, the step of forming the cap film over the semiconductor substrate is performed after the step of irradiating the semiconductor substrate with the accelerated hydrogen ions to form the embrittled region in the semiconductor substrate.

The cap film covering the substrate has higher ability to suppress dissipation of hydrogen from the substrate as the thickness thereof is larger, but when irradiation with hydrogen ions is performed through the cap film to form the embrittled region, it is necessary to increase acceleration energy of hydrogen ions. However, according to the above embodiment of the present invention, since the semiconductor substrate is irradiated with hydrogen ions before formation of the cap film, the embrittled region can be formed in the semiconductor substrate without increasing the acceleration energy of hydrogen ions regardless of the thickness of the cap film formed in a later step.

According to another embodiment of the present invention, in the method for manufacturing an SOI substrate, the cap film contains silicon nitride.

According to the above embodiment of the present invention, since the cap film contains silicon nitride having a high gas barrier property and a high hydrogen concentration, dissipation of hydrogen from the surface of the semiconductor substrate can be suppressed effectively.

According to another embodiment of the present invention, in the method for manufacturing an SOI substrate, the cap film over the semiconductor substrate in which the embrittled region is formed is bonded to the base substrate with the use of a bond layer.

According to the above embodiment of the present invention, since the bond layer helps bonding between the substrate and the cap film, a wide variety of materials can be used for the cap film.

Note that in this specification, silicon oxynitride contains more oxygen than nitrogen and, in the case where measurements are performed using Rutherford backscattering spectrometry (RBS) and hydrogen forward scattering (HFS), contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are performed using RBS and HFS, contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The term "single crystal" in this specification is crystal in which crystal faces and crystal axes are aligned and constituent atoms or molecules of which are in a spatially ordered arrangement. Although single crystal is structured by orderly arranged atoms, single crystal may partly include a lattice defect in which the arrangement is disordered or single crystal may include intended or unintended lattice strain.

The term "semiconductor device" in this specification means devices in general that can operate by utilizing semiconductor characteristics, and electro-optical devices, semiconductor circuits, and electronic devices including semiconductor elements are all included in the category of the semiconductor device.

In accordance with an embodiment of the present invention, it is possible to provide a method for manufacturing an SOI substrate, in which a semiconductor layer can be transferred from a semiconductor substrate to a base substrate at low heat treatment temperature without increasing the irradiation amount of accelerated hydrogen ions.

It is possible to provide an SOI substrate including a semiconductor film with a small number of crystal defects.

It is possible to provide a method for manufacturing, with high yield, an SOI substrate with no unevenness.

It is possible to provide a method for manufacturing an SOI substrate, in which time for irradiation with hydrogen ions is short.

BRIEF DESCRIPTION OF THE DRAWINGS

FIGS. 1A-1 to 1D illustrate a manufacturing process of a semiconductor substrate according to an embodiment.

FIGS. 3A-1 to 3D illustrate a manufacturing process of a semiconductor substrate according to an embodiment.

DETAILED DESCRIPTION OF THE INVENTION

Embodiments will be described in detail with reference to the drawings. Note that the present invention is not limited to the following description, and it will be easily understood by those skilled in the art that modes and details thereof can be variously changed without departing from the spirit and the scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, a method for manufacturing an SOI substrate in which a semiconductor layer is provided over a base substrate with an insulating layer interposed therebetween will be described with reference to FIGS. 1A-1 to 1D and FIGS. 2A and 2B. Specifically, a method for manufacturing a substrate in which a semiconductor layer is provided over a base substrate with an insulating layer interposed therebetween will be described; in the method, a cap film which prevents dissipation of hydrogen from a semiconductor substrate and supplies hydrogen to a region between an embrittled region and a surface of the semiconductor substrate is formed over the semiconductor substrate, the semiconductor substrate is irradiated with accelerated hydrogen ions to form the embrittled region, heating is performed after bonding the semiconductor substrate to the base substrate, and the semiconductor layer is transferred from the semiconductor substrate to the base substrate.

Figure 1A:
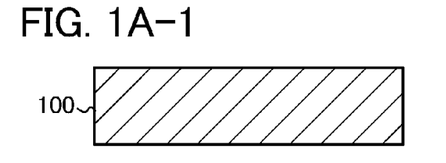

First, a semiconductor substrate 100 is prepared (see FIG. 1A-1).

As the semiconductor substrate 100, a single crystal semiconductor substrate or a polycrystalline semiconductor substrate can be used. For example, as the semiconductor substrate 100, a single crystal or polycrystalline silicon substrate, a single crystal or polycrystalline germanium substrate, or a compound semiconductor substrate of gallium arsenide, indium phosphide, or the like can be used.

In this embodiment, the case where a single crystal silicon substrate is used as the semiconductor substrate 100 will be described.

As a commercial silicon substrate, a circular substrate which is 5 inches (125 mm) in diameter, 6 inches (150 mm) in diameter, 8 inches (200 mm) in diameter, 12 inches (300 mm) in diameter, or 16 inches (400 mm) in diameter is typically used. Note that the shape is not limited to a circular shape, and a silicon substrate processed into a rectangular shape or the like can be used as the semiconductor substrate 100.

In addition, it is preferable that a surface of the semiconductor substrate 100 be cleaned as appropriate in advance using a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like in terms of removing contamination. Further, diluted hydrogen fluoride and ozone water may be discharged alternately to clean the semiconductor substrate 100.

Next, an oxide film 102 is formed over a surface of the semiconductor substrate 100 (see FIG. 1A-2). The oxide film 102 is not necessarily formed but is preferably provided because a difference in stress between a cap film and a silicon film to be a semiconductor layer can be reduced and variation in device characteristics can be suppressed.

Figure 1A:
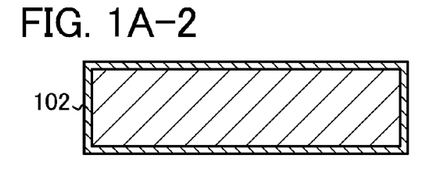

The oxide film 102 can be formed by a thermal oxidation method, a CVD method, a sputtering method, or the like. When the oxide film 102 is formed by a CVD method, a silicon oxide film formed by using organosilane such as tetraethoxysilane (abbreviation: TEOS, chemical formula: $Si(OC_2H_5)_4$) is preferably formed as the oxide film 102 in terms of productivity.

In this embodiment, the oxide film 102 (here, a $SiO_x$ film) is formed by performing thermal oxidation treatment on the semiconductor substrate 100. The thermal oxidation treatment is preferably performed in an oxidizing atmosphere to which a halogen is added. For example, the semiconductor substrate 100 is subjected to thermal oxidation treatment in an oxidizing atmosphere into which a chlorine (Cl) gas is introduced, whereby the oxide film 102 is formed through chlorine oxidation. In this case, the oxide film 102 contains chlorine atoms.

The chlorine atoms contained in the oxide film 102 form distortions. As a result, the moisture absorptance of the oxide film 102 is increased and the diffusion speed is increased. That is, when moisture is present on a surface of the oxide film 102, the moisture present on the surface of the oxide film 102 can be rapidly absorbed and diffused into the oxide film 102.

As an example of thermal oxidation treatment, thermal oxidation can be performed in an oxidizing atmosphere which contains hydrogen chloride (HCl) at 0.5 vol. % to 10 vol. % (preferably, 2 vol. %) with respect to oxygen at a temperature of 900° C. to 1150° C. (typically, 1000° C.) (HCl oxidation). Treatment time may be 0.1 hours to 6 hours, preferably, 0.5 hours to 1 hour. The thickness of the oxide film that is formed is set to 10 nm to 1000 nm (preferably, 50 nm to 300 nm), for example, 100 nm.

As another example of thermal oxidation treatment, thermal oxidation can be performed in an oxidizing atmosphere which contains trans-1,2-dichloroethylene (DCE) at 0.25 vol. % to 5 vol. % (preferably, 3 vol. %) with respect to oxygen at a temperature of 700° C. to 1150° C. (typically, 950° C.). Treatment time may be 0.1 hours to 6 hours, preferably, 0.5 hours to 1 hour. The thickness of the oxide film that is formed is set to 10 nm to 1000 nm (preferably, 50 nm to 300 nm), for example, 100 nm.

Since trans-1,2-dichloroethylene is thermally degraded at low temperature, thermal oxidation treatment can be performed at low temperature by using trans-1,2-dichloroethylene. In particular, when the semiconductor substrate 100 is repeatedly used, productivity can be improved and adverse effect due to thermal shock can be reduced by performing thermal oxidation treatment at low temperature. Note that, instead of trans-1,2-dichloroethylene, cis-1,2-dichloroethylene, 1,1-dichloroethylene, or a mixed gas of two or more of these gases may be used.

In this embodiment, the concentration of chlorine atoms in the oxide film 102 is controlled to be $1 \times 10^{17}$ atoms/cm$^3$ to $1 \times 10^{21}$ atoms/cm$^3$.

The oxide film 102 containing chlorine atoms is effective in preventing contamination of the semiconductor substrate 100 because heavy metal (for example, Fe, Cr, Ni, or Mo) that is an extrinsic impurity is trapped.

Further, the oxide film 102 containing a halogen such as chlorine can getter impurities (e.g., movable ions of Na or the like) which adversely affect the semiconductor substrate 100. That is, by heat treatment which is performed after the oxide film 102 is formed, impurities contained in the semiconductor substrate 100 are separated out to the oxide film 102 and captured by reaction with the halogen (e.g., chlorine). Accordingly, the impurities captured in the oxide film 102 can be fixed and prevented from contaminating the semiconductor substrate 100. That is, when bonded to a glass substrate, the oxide film 102 containing a halogen such as chlorine can serve as a film for neutralizing impurities such as Na included in the glass substrate.

In particular, inclusion of a halogen such as chlorine in the oxide film 102 by HCl oxidation or the like is effective in the case where the semiconductor substrate 100 is not sufficiently cleaned or in removing contamination of the semiconductor substrate 100 which is repeatedly used.

Further, inclusion of hydrogen in the gas for the thermal oxidation treatment has an effect of compensating a defect at the interface between the semiconductor substrate 100 and the oxide film 102 to decrease the localized state density of the interface. Therefore, it is preferable that the oxide film 102 contain hydrogen atoms at a concentration of higher than or equal to $1 \times 10^{18}$ atoms/cm$^3$.

Although the case where the thermal oxidation treatment is performed in an oxidizing atmosphere in which hydrogen chloride or dichloroethylene is contained as a formation method of the oxide film 102 containing chlorine atoms is described in the above description, an embodiment of the present invention is not limited thereto. For example, after the oxide film 102 (e.g., an $SiO_x$ film) is formed over the surface of the semiconductor substrate 100 by performing thermal oxidation treatment on the semiconductor substrate 100 in an oxidizing atmosphere, chlorine atoms may be contained in the oxide film 102 by adding chlorine ions accelerated by an electric field with the use of an ion doping apparatus or an ion implantation apparatus. Alternatively, after the surface is subjected to treatment with a hydrogen chloride (HCl) aqueous solution (hydrochloric acid), thermal oxidation treatment may be performed in an oxidizing atmosphere.

Note that halogen atoms contained in the oxide film 102 are not limited to the chlorine atoms. The oxide film 102 may contain fluorine atoms. In order to perform fluorine oxidation on the surface of the semiconductor substrate 100, any of the following methods may be used: a method in which after immersion of the surface of the semiconductor substrate 100 in an HF solution, thermal oxidation treatment is performed in an oxidizing atmosphere; and a method in which thermal oxidation treatment is performed on the semiconductor substrate 100 in an oxidizing atmosphere to which $NF_3$ is added.

Then, a cap film 105 is formed over the semiconductor substrate 100 with the oxide film 102 interposed therebetween (see FIG. 1A-3). As the cap film 105, a film that is excellent in gas barrier property and has the hydrogen concentration greater than or equal to the irradiation amount of accelerated hydrogen ions is used.

Figure 1A:
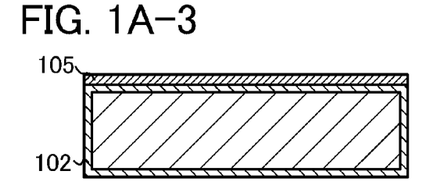

When the cap film 105 has a gas barrier property, a phenomenon in which hydrogen diffused from an embrittled region is dissipated through the cap film 105 can be suppressed. Further, the cap film 105 having the hydrogen concentration greater than or equal to the irradiation amount of accelerated hydrogen ions described later serves as a hydrogen supply source which supplies hydrogen to the adjacent layer.

As the cap film 105, a single-layer film of silicon nitride, silicon nitride oxide, silicon oxynitride, silicon oxide, or the like, or a layered film including two or more of them can be used. These films can be formed by a CVD method, a sputtering method, or the like.

In this embodiment, as the cap film 105, a single-layer silicon nitride film or silicon nitride oxide film is used. A silicon nitride film or a silicon nitride oxide film is excellent in gas barrier property. Moreover, by forming such a film by a plasma CVD method in which a silane gas, an ammonia gas, and a hydrogen gas are used as a source gas, the hydrogen concentration of the film can be increased.

Note that the cap film 105 may contain a rare gas as well as hydrogen. As the rare gas, for example, an element of Group 18 such as argon, helium, or xenon can be used. As a method by which a rare gas is contained in the cap film 105, a method in which the cap film 105 is formed by a sputtering method with the use of a gas to which a rare gas is added can be given.

The cap film 105 containing a rare gas serves as a rare gas supply source which supplies a rare gas to the adjacent layer.

Next, an embrittled region 104 is formed in the semiconductor substrate 100 (see FIG. 1A-4). The semiconductor substrate 100 is irradiated with ions having kinetic energy and a crystal structure at a predetermined depth in the semiconductor substrate 100 is damaged, whereby the embrittled region 104 is formed.

Figure 1A:
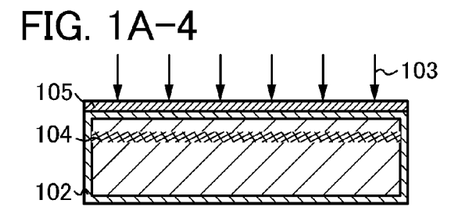

In this embodiment, the semiconductor substrate 100 is irradiated with accelerated ions 103 through the oxide film 102 and the cap film 105. As the accelerated ions 103, ion species ($H^+$, $H_2^+$, and $H_3^+$) generated from a hydrogen gas can be used. The irradiation amount of hydrogen ions for forming the embrittled region is set to greater than or equal to $5\times10^{20}$ atoms/cm$^3$ and less than or equal to $3\times10^{21}$ atoms/cm$^3$, preferably greater than or equal to $8\times10^{20}$ atoms/cm$^3$ and less than or equal to $2\times10^{21}$ atoms/cm$^3$, more preferably greater than or equal to $1\times10^{21}$ atoms/cm$^3$ and less than $2\times10^{21}$ atoms/cm$^3$.

The step of forming the embrittled region 104 is performed after the step of forming the oxide film 102 and the cap film 105, whereby the temperature at which the oxide film 102 and the cap film 105 are formed can be more freely determined. Specifically, the oxide film 102 and the cap film 105 can be formed even at a temperature of higher than or equal to 400° C. This is because when the semiconductor substrate 100 in which the embrittled region 104 is formed is heated to a high temperature, a single crystal semiconductor layer 124 is separated along the embrittled region 104 and it is difficult to form the oxide film 102 or the cap film 105.

In a method for generating the accelerated ions 103, for example, a source gas is excited to produce plasma and ions included in the plasma are extracted from the plasma by an effect of an electric field and accelerated. The accelerated ions 103 are not limited to ion species generated from the hydrogen gas, and He ions or the like can be used alone or in combination with ion species of other elements.

The ions 103 are added to a region at a predetermined depth from the surface of the semiconductor substrate 100 to form the embrittled region 104. In that case, the depth of the region where the embrittled region 104 is formed can be adjusted by kinetic energy, mass, the incident angle, or the like of the ions 103. Kinetic energy can be adjusted by acceleration voltage, dose, or the like. The embrittled region 104 is formed at the same depth or substantially the same depth as the average depth at which the ions 103 have entered. Thus, the thickness of a semiconductor layer separated from the semiconductor substrate 100 is determined by the depth at which the ions 103 are added. The depth at which the embrittled region 104 is formed is adjusted such that the thickness of this semiconductor layer is greater than or equal to 10 nm and less than or equal to 500 nm, preferably greater than or equal to 50 nm and less than or equal to 200 nm.

The embrittled region 104 can be formed by ion doping treatment. The ion doping treatment can be performed with an ion doping apparatus. An ion doping apparatus is typically a non-mass-separation type apparatus for irradiating an object to be processed which is disposed in a chamber with all kinds of ion species which are generated by plasma excitation of a process gas. The apparatus is called "non-mass-separation type apparatus" because an object to be processed is irradiated with all kinds of ion species without mass separation of ion species in plasma. In contrast, an ion implantation apparatus is a mass-separation type apparatus. An ion implantation apparatus is an apparatus for irradiating an object to be processed with ion species having a specific mass after mass separation of ion species in plasma.

Main components of the ion doping apparatus are as follows: a chamber in which an object to be processed is disposed, an ion source for generating desired ions, and an acceleration mechanism for acceleration of ions and for irradiation therewith. The ion source includes a gas supply device for supplying a source gas to generate desired ion species, an electrode for exciting a source gas to produce plasma, and the like. As the electrode for producing plasma, a filament electrode, a capacitively coupled high-frequency discharge electrode, or the like is used. The acceleration mechanism includes electrodes such as an extraction electrode, an acceleration electrode, a deceleration electrode, and a ground electrode; a power supply for supplying power to these electrodes; and the like. These electrodes included in the acceleration mechanism are provided with a plurality of openings or slits, through which ions that are generated in the ion source are accelerated. Note that components of the ion doping apparatus are not limited to the above-described components and an as-needed mechanism may be provided.

In this embodiment, hydrogen is added to the semiconductor substrate 100 with an ion doping apparatus. A gas containing hydrogen is supplied as a plasma source gas. For example, $H_2$ is supplied. A hydrogen gas is excited to produce plasma, ions included in the plasma are accelerated without mass separation, and the semiconductor substrate 100 is irradiated with the accelerated ions.

In an ion doping apparatus, the percentage of $H_3^+$ with respect to the total amount of ion species ($H^+$, $H_2^+$, and $H_3^+$) that are generated from a hydrogen gas is set to higher than or equal to 50%. Preferably, the percentage of $H_3^+$ is set to higher than or equal to 80%. Because an ion doping apparatus does not involve mass separation, the percentage of one kind of ion species ($H_3^+$) with respect to plural kinds of ion species that are generated in plasma is preferably higher than or equal to 50%, more preferably higher than or equal to 80%. By irradiation with ions having the same mass, ions can be added in a concentrated manner to the same depth in the semiconductor substrate 100.

In order to form the embrittled region 104 in a shallow region, the acceleration voltage for the ions 103 needs to be low. With an increase in the percentage of $H_3^+$ ions in plasma, atomic hydrogen (H) can be efficiently added to the semiconductor substrate 100. Because the mass of an $H_3^+$ ion is three times as large as that of an $H^+$ ion, when one hydrogen atom is added to the same depth, the acceleration voltage for an $H_3^+$ ion can be three times as high as that of an $H^+$ ion. When the acceleration voltage for ions can be increased, the cycle time for the step of ion irradiation can be shortened and productivity and throughput can be improved.

An ion doping apparatus is inexpensive and excellent for use in large-area treatment. Therefore, by irradiation with $H_3^+$ with the use of such an ion doping apparatus, significant effects such as an improvement in semiconductor characteristics, an increase in area, a reduction in costs, and an improvement in productivity can be obtained. Further, in the case where an ion doping apparatus is used, heavy metal may be introduced together with $H_3^+$; however, by irradiation with ions through the oxide film 102 containing chlorine atoms, the semiconductor substrate 100 can be prevented from being contaminated owing to the heavy metal as described above.

The step of irradiating the semiconductor substrate 100 with the accelerated ions 103 can also be performed with an ion implantation apparatus. The ion implantation apparatus is a mass-separation type apparatus with which an object to be processed that is placed in a chamber is irradiated with specific ion species obtained by mass separation of a plurality of ion species that are generated by plasma excitation of a source gas. Thus, in the case of using an ion implantation apparatus, $H^+$ ions and $H_2^+$ ions that are generated by excitation of a hydrogen gas or $PH_3$ are subjected to mass separation, and either $H^+$ ions or $H_2^+$ ions are accelerated, with which the semiconductor substrate 100 is irradiated.

Next, a base substrate 120 is prepared (see FIG. 1B-1).

Figure 1B:
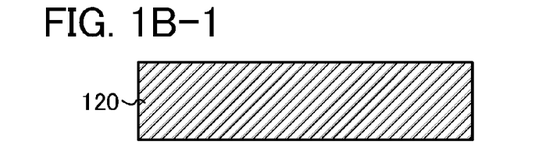

As the base substrate 120, a substrate made of an insulator is used. Specific examples thereof are a variety of glass substrates used in the electronics industry, such as substrates of aluminosilicate glass, aluminoborosilicate glass, and barium borosilicate glass, a quartz substrate, a ceramic substrate, and a sapphire substrate.

In this embodiment, the case where a glass substrate is used is described. When a glass substrate that can be manufactured in large size and is inexpensive is used as the base substrate 120, cost reduction can be achieved as compared with the case where a silicon wafer is used.

Note that a surface of the base substrate 120 is preferably cleaned in advance. Specifically, ultrasonic cleaning is performed on the base substrate 120 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, ultrasonic cleaning is preferably performed on the surface of the base substrate 120 using a hydrochloric acid/hydrogen peroxide mixture. By such cleaning treatment, the surface of the base substrate 120 can be planarized and abrasive particles remaining on the surface can be removed.

Next, a bond layer 121 is formed over the surface of the base substrate 120 (see FIG. 1B-2). The bond layer 121 is a layer which is bonded to the cap film 105 formed over the semiconductor substrate 100. The bond layer 121 is not necessarily formed but is preferably provided because bonding failure between the semiconductor substrate 100 and the base substrate 120 can be suppressed.

Figure 1B:
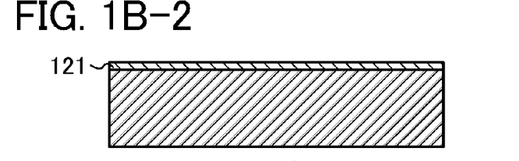

In this embodiment, a silicon oxide film formed by a CVD method can be used as the bond layer 121.

Further, a surface of the bond layer 121 is preferably smoothed for suppressing bonding failure between the semiconductor substrate 100 and the base substrate 120. Specifically, the bond layer 121 is preferably formed to have an average surface roughness (Ra) of less than or equal to 0.5 nm and a root-mean-square roughness (Rms) of less than or equal to 0.60 nm, more preferably an average surface roughness of less than or equal to 0.35 nm and a root-mean-square roughness of less than or equal to 0.45 nm. The thickness is preferably greater than or equal to 10 nm and less than or equal to 200 nm, more preferably greater than or equal to 50 nm and less than or equal to 100 nm.

Figure 1C:
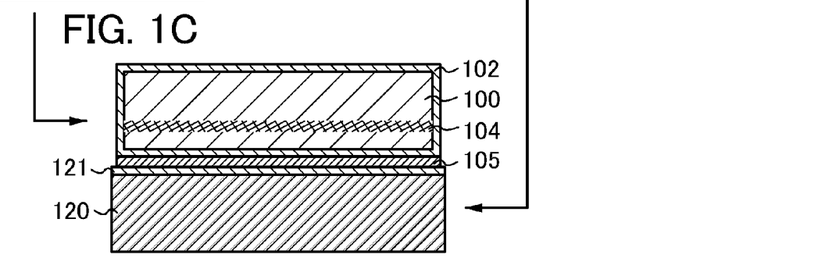

Next, the surface of the semiconductor substrate 100 and the surface of the base substrate 120 are disposed to face each other, and the surface of the cap film 105 and the surface of the bond layer 121 are bonded to each other (see FIG. 1C).

In this embodiment, after the semiconductor substrate 100 and the base substrate 120 are disposed in close contact with each other, a pressure of about 0.1 N/cm$^2$ to 500 N/cm$^2$, preferably 1 N/cm$^2$ to 20 N/cm$^2$ is applied to a part of the semiconductor substrate 100. A bonding between the cap film 105 and the bond layer 121 begins at the part where the pressure is applied, and then spontaneous bonding proceeds throughout the surface. This bonding step is performed by Van der Waals force or hydrogen bond at normal temperature without heat treatment. Therefore, a substrate with low heat resistance temperature, such as a glass substrate, can be used as the base substrate 120.

Note that before the semiconductor substrate 100 and the base substrate 120 are bonded to each other, the cap film 105 formed over the semiconductor substrate 100 and the bond layer 121 formed over the base substrate 120 are preferably subjected to surface treatment. As surface treatment, ozone treatment (such as cleaning with ozone water), megasonic cleaning, two-fluid cleaning (a method for spraying functional water such as pure water or hydrogen-containing water with a carrier gas such as nitrogen), or a combination thereof can be performed. Further, cleaning with ozone water and cleaning with hydrofluoric acid may be repeated plural times.

In addition, after the semiconductor substrate 100 is bonded to the base substrate 120, heat treatment is preferably performed in order to increase the bonding strength between the cap film 105 and the bond layer 121. This heat treatment is performed at a temperature at which a crack is not generated in the embrittled region 104 and is performed at a temperature of higher than or equal to room temperature and lower than 400° C., for example. Alternatively, the cap film 105 and the bond layer 121 may be bonded to each other while being heated at a temperature in this temperature range. For this heat treatment, a diffusion furnace, a heating furnace such as a resistance heating furnace, a rapid thermal annealing (RTA) apparatus, a microwave heating apparatus, or the like can be used.

In this embodiment, bonding strength is increased by performing heat treatment at 200° C. for 2 hours.

In general, when heat treatment is performed at the same time as or after bonding of the cap film 105 and the bond layer 121, dehydration reaction at the bonding interface proceeds and bonding is strengthened by strengthening of hydrogen bond and formation of covalent bond. In order to promote the dehydration reaction, moisture generated at the bonding interface through the dehydration reaction should be removed by heat treatment at high temperature. In other words, when heat treatment after bonding is performed at low temperature, moisture generated at the bonding interface through the dehydration reaction cannot be removed effectively; thus, the dehydration reaction does not proceed and bonding strength cannot be improved sufficiently.

Figure 1D:
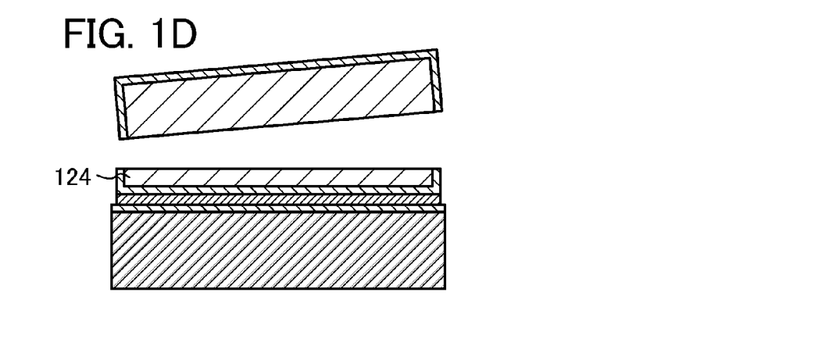

Then, heat treatment is performed on the semiconductor substrate 100, so that the single crystal semiconductor layer 124 is separated along the embrittled region 104, and the single crystal semiconductor layer 124 is provided over the base substrate 120 with the cap film 105 and the bond layer 121 interposed therebetween (see FIG. 1D).

This heat treatment can be performed using a diffusion furnace, a heating furnace such as a resistance heating furnace, an RTA apparatus, a microwave heating apparatus, or the like. For example, in the case of using an RTA apparatus, the heat treatment can be performed at a temperature of higher than or equal to 550° C. and lower than or equal to 730° C.

In this embodiment, heat treatment is performed at 600° C. for 2 hours, whereby the single crystal semiconductor layer 124 is separated along the embrittled region 104.

Figure 2A:
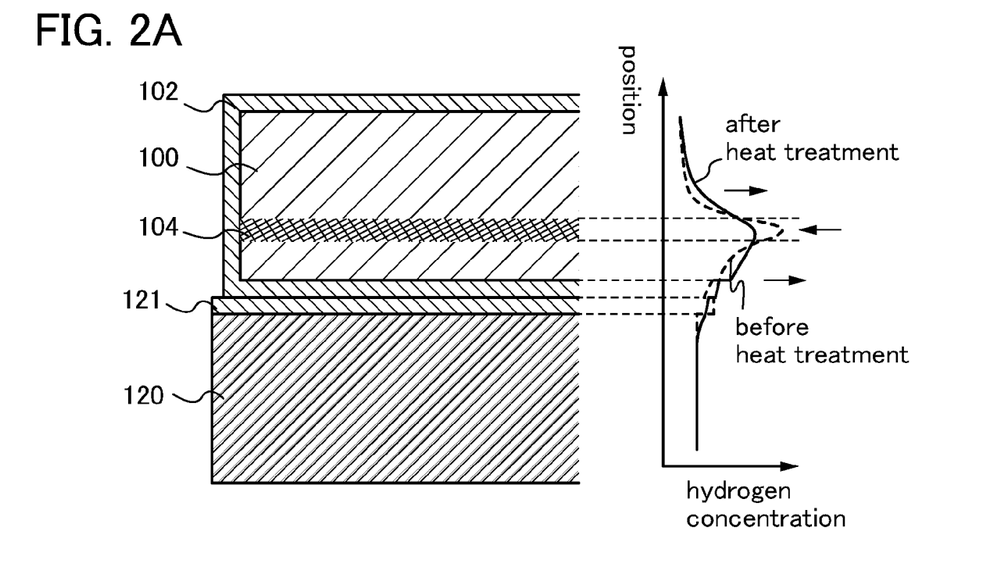
FIGS. 2A and 2B each show the hydrogen concentration in a manufacturing process of a semiconductor substrate according to an embodiment.
Figure 2B:
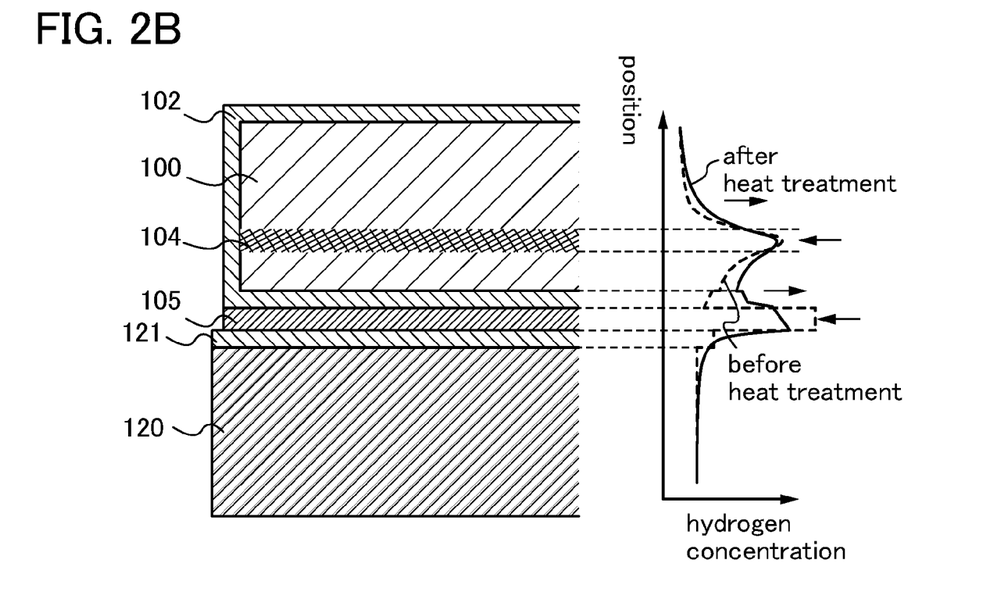

FIGS. 2A and 2B show how the cap film 105 influences the hydrogen concentration that is changed by the heat treatment in a region of the semiconductor substrate 100, which is between the embrittled region 104 and the cap film 105. FIG. 2A illustrates the structure in the case where the base substrate 120 and the semiconductor substrate 100 that is not provided with the cap film 105 are bonded to each other with the oxide film 102 and the bond layer 121 interposed therebetween. FIG. 2B illustrates the structure in the case where the base substrate 120 and the semiconductor substrate 100 that is provided with the cap film 105 are bonded to each other with the oxide film 102 and the bond layer 121 interposed therebetween. Note that in each structure, the hydrogen concentration before the heat treatment and the hydrogen concentration after the heat treatment which are distributed in the thickness direction of the substrate are denoted by a dashed line and a solid line, respectively.

Before the heat treatment, the hydrogen concentration has the highest value in the embrittled region 104 in the semiconductor substrate 100. After that, hydrogen is diffused from a region with a high hydrogen concentration to a region at a low hydrogen concentration along with the heat treatment. In particular, in the case of the semiconductor substrate 100 that is not provided with the cap film 105, the highest value of the hydrogen concentration in the embrittled region 104 is lowered as denoted by an arrow in the drawing, and hydrogen distribution spreads to the periphery of the embrittled region (see FIG. 2A). When the hydrogen concentration of the embrittled region 104 is lowered, a crack is not generated in the embrittled region 104 even when the heat treatment is performed, and the semiconductor layer is not separated from the semiconductor substrate 100, which is a problem.

However, diffusion of hydrogen from the embrittled region 104 is suppressed by the cap film 105 in the case of the semiconductor substrate described in this embodiment in which a surface close to the embrittled region 104 is provided with the cap film 105. Further, hydrogen is diffused from the cap film 105 toward the embrittled region in the semiconductor substrate, so that the hydrogen concentration of a region from the surface of the semiconductor substrate to the embrittled region 104 is increased, which makes the gradient of the hydrogen concentration gentle. Consequently, the amount of hydrogen that is diffused from the embrittled region to the surface side of the semiconductor substrate is suppressed, so that the hydrogen concentration of the embrittled region 104 is not easily lowered (see FIG. 2B).

In particular, as long as the hydrogen concentration of the cap film is greater than or equal to the irradiation amount of the accelerated hydrogen ions, the cap film 105 can effectively serve as a hydrogen supply source, so that hydrogen can be diffused to the semiconductor substrate 100 through the oxide film 102. As a result, the hydrogen concentration of a region from the cap film to the embrittled region is increased, which makes the gradient of the hydrogen concentration gentle, thereby suppressing hydrogen diffusion from the embrittled region.

With an increase in temperature by the heat treatment, volume change occurs in microvoids formed in the embrittled region 104 and a crack is generated in the embrittled region 104, whereby the semiconductor substrate 100 is separated along the embrittled region 104. Because the cap film 105 is bonded to the base substrate 120 with the bond layer 121 interposed therebetween, the single crystal semiconductor layer 124 which is separated from the semiconductor substrate 100 is formed over the base substrate 120. This heat treatment is performed at a temperature not exceeding the strain point of the base substrate 120.

In addition, without performing the above-described heat treatment for increasing the bonding strength between the cap film 105 and the bond layer 121, the heat treatment of FIG. 1D may double as a heat treatment step for increasing the bonding strength between the cap film 105 and the bond layer 121 and a heat treatment step for causing separation of the single crystal semiconductor layer 124 along the embrittled region 104.

Through the above steps, an SOI substrate in which the single crystal semiconductor layer 124 is provided over the base substrate 120 with the cap film 105 and the bond layer 121 interposed therebetween can be manufactured.

Note that the surface of the SOI substrate may be subjected to planarization treatment. In the case where the surface of the single crystal semiconductor layer 124 provided over the base substrate 120 becomes uneven, the planarization treatment is useful.

The planarization treatment can be performed by chemical mechanical polishing (CMP), etching treatment, laser light irradiation, or the like, for example.

In this embodiment, the single crystal semiconductor layer 124 is recrystallized and its surface is planarized by being irradiated with laser light after etching treatment (etch-back treatment) is performed by either dry etching or wet etching or by both in combination.

By irradiation with laser light from an upper surface side of the single crystal semiconductor layer 124, the upper surface of the single crystal semiconductor layer 124 can be melted. After being melted, the single crystal semiconductor layer 124 is cooled and solidified, so that the single crystal semiconductor layer 124 having an upper surface whose planarity is improved can be obtained. With the use of laser light, the base substrate 120 is not directly heated; thus, increase in the temperature of the base substrate 120 can be suppressed. Accordingly, a substrate having low heat resistance, such as a glass substrate, can be used as the base substrate 120.

Note that it is preferable that the single crystal semiconductor layer 124 be partly melted by laser light irradiation. This is because, if the single crystal semiconductor layer 124 is completely melted, it is microcrystallized due to disordered nucleation after being in a liquid phase, so that crystallinity thereof is highly likely to decrease. On the other hand, by partial melting, crystal growth proceeds from a non-melted solid phase part. Accordingly, defects in the semiconductor layer can be reduced. Note that "complete melting" herein means that the single crystal semiconductor layer 124 is melted into a liquid state down to the vicinity of its lower interface. On the other hand, "partial melting" in this case means that the upper portion of the single crystal semiconductor layer 124 is melted into a liquid phase, but the lower portion is not melted and remains in a solid phase.

A pulsed laser is preferably used for the laser light irradiation. This is because instantaneously high-energy pulsed laser light can be oscillated and emitted and the melting state can be easily obtained. The repetition rate is preferably approximately higher than or equal to 1 Hz and lower than or equal to 10 MHz.

Further, a thinning step may be performed after the planarization treatment. The thinning step is a step for decreasing the thickness of the single crystal semiconductor layer 124. The single crystal semiconductor layer 124 may be thinned by etching treatment (etch-back treatment) by either dry etching or wet etching or by both in combination. For example, when the single crystal semiconductor layer 124 is formed of a silicon material, the single crystal semiconductor layer 124 can be thinned by dry etching using $SF_6$ and $O_2$ as a process gas.

Note that not only the SOI substrate but also the semiconductor substrate 100 after separation may be subjected to planarization treatment. By planarizing the surface of the semiconductor substrate 100 which has been separated, the semiconductor substrate 100 can be reused in a process for manufacturing another SOI substrate.

<Modification Example>

The method for manufacturing an SOI substrate described in this embodiment is just an embodiment of the present invention. The present invention also includes a method for manufacturing an SOI substrate, which is partly different from the method for manufacturing an SOI substrate described in this embodiment.

For example, after the step of forming the embrittled region 104 by irradiating the semiconductor substrate 100 with ions having kinetic energy (see FIG. 1A-4), preheating of the semiconductor substrate 100 can be performed. Note that the temperature of this preheating is lower than 400° C.

The preheating is performed on the semiconductor substrate 100 whose surface is provided with the cap film 105 having a gas barrier property and containing hydrogen and in which the embrittled region 104 is formed. In that case, the cap film 105 can suppress distribution of hydrogen from the embrittled region 104 and can supply hydrogen to the embrittled region 104 through the oxide film 102.

Through the above step, hydrogen can be supplied from the cap film to the embrittled region through the surface of the semiconductor substrate more effectively. Moreover, thermal budget (heat history) and/or heating unevenness due to an uneven glass substrate can be suppressed.

As an example, preheating may be performed at a temperature less than 400° C. for 2 hours, so that hydrogen may be supplied from the cap film 105.

According to the method for manufacturing an SOI substrate described in this embodiment, with the cap film provided over the surface of the semiconductor substrate, a phenomenon in which hydrogen is dissipated from the semiconductor substrate by the heat treatment can be suppressed and the hydrogen concentration of the embrittled region can be maintained, so that the irradiation amount of accelerated hydrogen ions can be reduced. In particular, the cap film which has the hydrogen concentration greater than or equal to the irradiation amount of hydrogen ions can effectively serve as a hydrogen supply source, so that distribution of hydrogen from the embrittled region can be suppressed.

Consequently, a cleavage plane can be formed effectively in the embrittled region. Thus, even when the irradiation amount of hydrogen ions is small, the semiconductor layer can be transferred from the semiconductor substrate to the base substrate at low heat treatment temperature.

This embodiment can be combined with any of the other embodiments in this specification as appropriate.

(Embodiment 2)

In this embodiment, a method for manufacturing an SOI substrate in which a semiconductor layer is provided over a base substrate with an insulating layer interposed therebetween will be described with reference to FIGS. 3A-1 to 3D. Specifically, a method for manufacturing a substrate in which a semiconductor layer is provided over a base substrate with an insulating layer interposed therebetween will be described; in the method, after an embrittled region is formed by irradiating a semiconductor substrate with accelerated hydrogen ions, a cap film which prevents diffusion of hydrogen from the embrittled region and supplies hydrogen to a region between the embrittled region and a surface of the semiconductor substrate is formed, and then, heating is performed after bonding the semiconductor substrate to the base substrate, and the semiconductor layer is transferred from the semiconductor substrate to the base substrate.

Figure 3A:
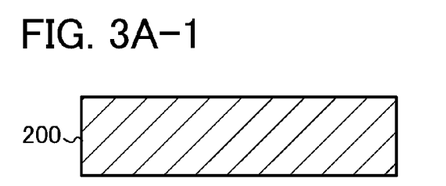
Figure 3A:
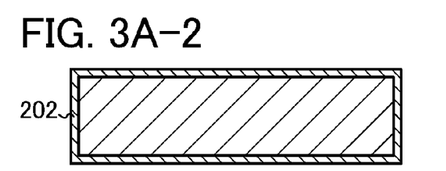

For a semiconductor substrate 200 and an oxide film 202 formed over a surface of the semiconductor substrate 200 which are described in this embodiment, materials, methods, and conditions of the semiconductor substrate 100 and the oxide film 102 formed over the surface of the semiconductor substrate 100 which are described in Embodiment 1 can be employed (see FIGS. 3A-1 and 3A-2). Specifically, the semiconductor substrate 200 can be a single crystal semiconductor substrate or a polycrystalline semiconductor substrate, and the oxide film 202 can be formed by a thermal oxidation method, a CVD method, a sputtering method, or the like. Therefore, Embodiment 1 can be referred to for the details thereof.

In this embodiment, as in Embodiment 1, a single crystal silicon substrate is used as the semiconductor substrate 200 and the oxide film 202 (here, an $SiO_x$ film) is formed by thermal oxidation treatment.

Next, an embrittled region 204 is formed in the semiconductor substrate 200 (see FIG. 3A-3). The embrittled region 204 described in this embodiment can be formed using a material and a method similar to those in the method for forming the embrittled region 104 described in Embodiment 1 except that the embrittled region 204 is formed in the semiconductor substrate 200 by ion irradiation only through the oxide film 202. Specifically, the semiconductor substrate 200 is irradiated with accelerated ions 203 through the oxide film 202. As the accelerated ions 203, ion species ($H^+$, $H_2^+$, and $H_3^+$) generated from a hydrogen gas can be used. The irradiation amount of hydrogen ions for forming the embrittled region is set to greater than or equal to $5\times10^{20}$ atoms/cm$^3$ and less than or equal to $3\times10^{21}$ atoms/cm$^3$, preferably greater than or equal to $8\times10^{20}$ atoms/cm$^3$ and less than or equal to $2\times10^{21}$ atoms/cm$^3$, more preferably greater than or equal to $1\times10^{21}$ atoms/cm$^3$ and less than to $2\times10^{21}$ atoms/cm$^3$. Therefore, Embodiment 1 can be referred to for the details thereof.

Figure 3A:
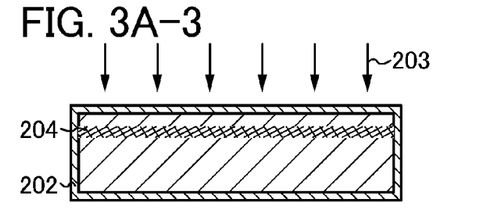

The step of forming the embrittled region 204 is performed before a step of forming a cap film 205 described later, whereby the acceleration energy of ions can be reduced. Since the cap film 205 which inhibits entry of the accelerated ions is not provided over the surface of the substrate, the embrittled region 204 can be formed by causing damage to a crystal structure at a predetermined depth in the semiconductor substrate 200 with low acceleration energy.

In this embodiment, hydrogen is added to the semiconductor substrate 200 with an ion doping apparatus as in Embodiment 1.

Then, the cap film 205 is formed over the semiconductor substrate 200 with the oxide film 202 interposed therebetween (see FIG. 3A-4). Since the embrittled region 204 has already been formed in the semiconductor substrate 200 described in this embodiment, the cap film 205 can be formed using a material and a method similar to those in the method for forming the cap film described in Embodiment 1 except that the cap film 205 is formed at a temperature at which a crack is not generated in the embrittled region 204. Specifically, a film that is excellent in gas barrier property and has the hydrogen concentration greater than or equal to the irradiation amount of hydrogen ions is used. Therefore, Embodiment 1 can be referred to for the details thereof.

Figure 3A:
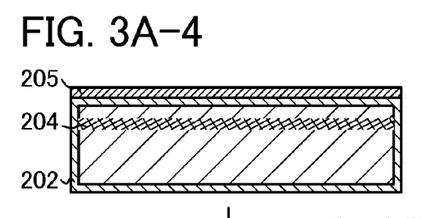

Since the cap film 205 has a gas barrier property, a phenomenon in which hydrogen is diffused from the embrittled region and dissipated through the cap film 205 can be suppressed. Further, the cap film 205 having the hydrogen concentration greater than or equal to the irradiation amount of accelerated hydrogen ions can serve as a hydrogen supply source which supplies hydrogen to the adjacent layer. In addition, the cap film 205 is formed after formation of the embrittled region 204, whereby it is not necessary to consider the effect that the cap film 205 inhibits entry of accelerated ions. Therefore, the cap film 205 can be formed thickly to improve its gas barrier property.

Figure 3B:
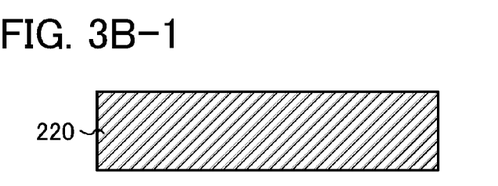
Figure 3B:
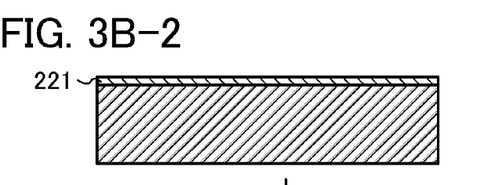
Figure 3C:
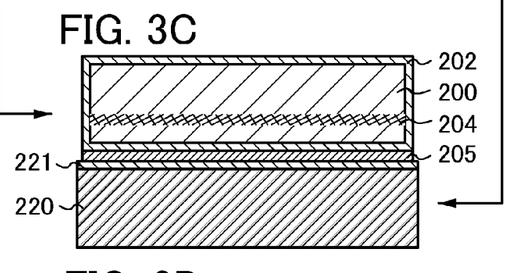
Figure 3D:
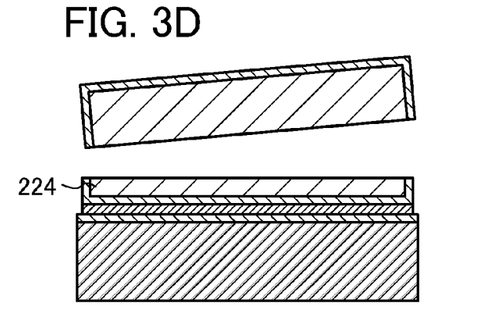

For a base substrate 220 and a bond layer 221 formed over a surface of the base substrate 220, materials, methods, and conditions of the base substrate 120 and the bond layer 121 formed over the surface of the base substrate 120 which are described in Embodiment 1 can be employed (see FIGS. 3B-1 and 3B-2). Specifically, any of a variety of glass substrates that are used in the electronics industry, a quartz substrate, a ceramic substrate, or a sapphire substrate can be used for the base substrate 220, and a silicon oxide film formed by a CVD method can be used for the bond layer 221. Therefore, Embodiment 1 can be referred to for the details thereof.

Materials, methods, and conditions described in Embodiment 1 can be used in the process including the step (see FIG. 3C) in which the surface of the semiconductor substrate 200 and the surface of the base substrate 220 are made to face each other and the surface of the cap film 205 and the surface of the bond layer 221 are bonded to each other and the step (see FIG. 3D) in which, by performing heat treatment on the semiconductor substrate 200, a single crystal semiconductor layer 224 is separated along the embrittled region 204 to form the single crystal semiconductor layer 224 over the base substrate 220 with the cap film 205 and the bond layer 221 interposed therebetween.

Specifically, after the semiconductor substrate 200 and the base substrate 220 are brought in close contact with each other, a pressure of about 0.1 N/cm² to 500 N/cm², preferably 1 N/cm² to 20 N/cm² is applied to a part of the semiconductor substrate 200. After that, heat treatment is performed at 200° C. for 2 hours so as to increase the bonding strength between the cap film 205 and the bond layer 221. Then, heat treatment is performed on the semiconductor substrate 200 at 600° C. for 2 hours, so that the single crystal semiconductor layer 224 is separated along the embrittled region 204, and the single crystal semiconductor layer 224 can be provided over the base substrate 220 with the cap film 205 and the bond layer 221 interposed therebetween (see FIG. 3D). Therefore, Embodiment 1 can be referred to for the details thereof.

Through the above steps, an SOI substrate in which the single crystal semiconductor layer 224 is provided over the base substrate 220 with the cap film 205 and the bond layer 221 interposed therebetween can be manufactured.

Note that the surface of the SOI substrate may be subjected to planarization treatment as in Embodiment 1. Further, a thinning step may be performed after the planarization treatment.

<Modification Example>

The method for manufacturing an SOI substrate described in this embodiment is just an embodiment of the present invention. The present invention also includes a method for manufacturing an SOI substrate, which is partly different from the method for manufacturing an SOI substrate described in this embodiment.

For example, after the step of forming the cap film 205 over the semiconductor substrate 200 with the oxide film 202 interposed therebetween (see FIG. 3A-4), preheating of the semiconductor substrate 200 can be performed. Note that the temperature of this preheating is lower than 400° C.

The preheating is performed on the semiconductor substrate 200 whose surface is provided with the cap film 205 having a gas barrier property and containing hydrogen and in which the embrittled region 204 is formed. In that case, the cap film 205 can suppress dissipation of hydrogen from the surface of the substrate and can supply hydrogen to the embrittled region 204 through the oxide film 202.

Through the above step, hydrogen can be supplied from the cap film more effectively. Moreover, thermal budget (heat history) and/or heating unevenness due to an uneven glass substrate can be suppressed.

As an example, preheating may be performed at a temperature less than 400° C. for 2 hours, so that hydrogen may be supplied from the cap film 205.

According to the method for manufacturing an SOI substrate described in this embodiment, with the cap film provided over the surface of the semiconductor substrate, a phenomenon in which hydrogen is dissipated from the semiconductor substrate by the heat treatment can be suppressed and the hydrogen concentration of the embrittled region can be maintained, so that the irradiation amount of accelerated hydrogen ions can be reduced. In particular, the cap film which has the hydrogen concentration greater than or equal to the irradiation amount of hydrogen ions can effectively serve as a hydrogen supply source, so that diffusion of hydrogen from the embrittled region can be suppressed.

Consequently, a cleavage plane can be formed effectively in the embrittled region. Thus, even when the irradiation amount of hydrogen ions is small, the semiconductor layer can be transferred from the semiconductor substrate to the base substrate at low heat treatment temperature.

This embodiment can be combined with any of the other embodiments in this specification as appropriate.

(Embodiment 3)

In this embodiment, a method for manufacturing a semiconductor device using the SOI substrate manufactured in any of the above embodiments will be described.

A method for manufacturing an n-channel thin film transistor and a p-channel thin film transistor will be described with reference to FIGS. 4A to 4D and FIGS. 5A to 5C. Various kinds of semiconductor devices can be formed by combining a plurality of thin film transistors (TFTs).

The case where the SOI substrate manufactured by the method of Embodiment 1 is used as an SOI substrate will be described. It is needless to say that the SOI substrate manufactured by the method of Embodiment 2 can be used.

Figure 4A:
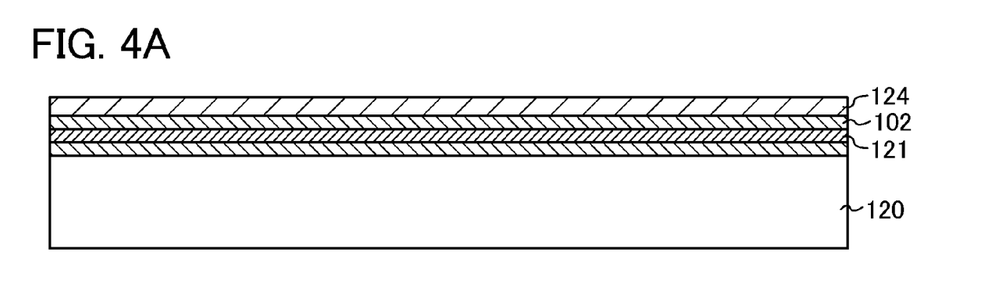
FIGS. 4A to 4D illustrate a manufacturing process of a semiconductor device according to an embodiment.

FIG. 4A is a cross-sectional view of an SOI substrate manufactured using the method described with reference to FIGS. 1A-1 to 1D.

Figure 4B:
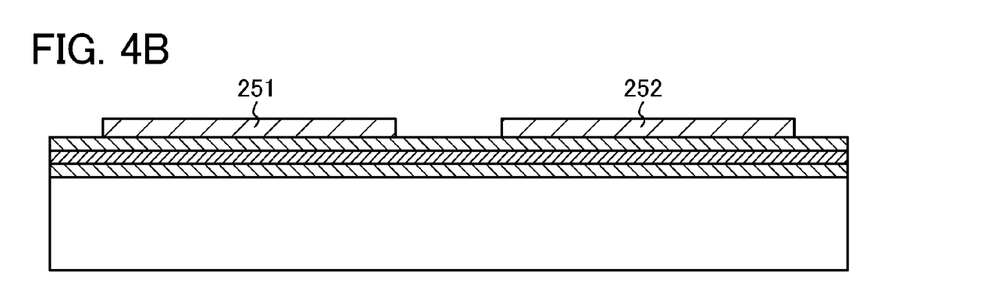

The single crystal semiconductor layer 124 is separated for elements by etching to form semiconductor layers 251 and 252 as illustrated in FIG. 4B. The semiconductor layer 251 is included in an n-channel TFT, and the semiconductor layer 252 is included in a p-channel TFT.

Figure 4C:
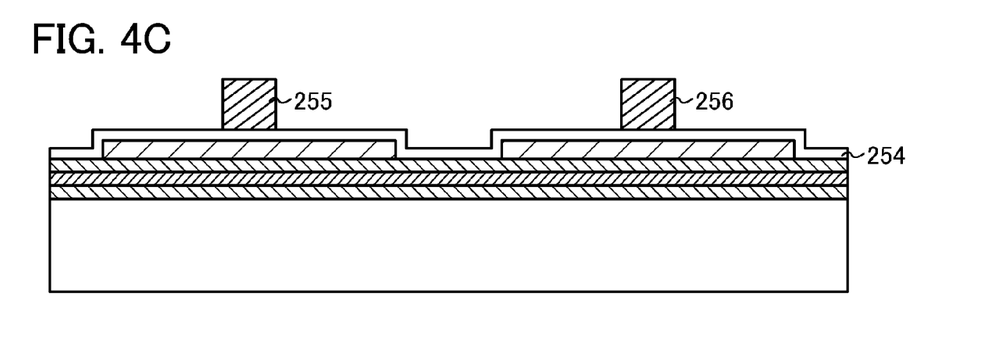

As illustrated in FIG. 4C, an insulating film 254 is formed over the semiconductor layers 251 and 252. Next, a gate electrode 255 is formed over the semiconductor layer 251 with the insulating film 254 interposed therebetween, and a gate electrode 256 is formed over the semiconductor layer 252 with the insulating film 254 interposed therebetween.

Note that, before the single crystal semiconductor layer 124 is etched, it is preferable to add an impurity element such as boron, aluminum, or gallium, or an impurity element such as phosphorus or arsenic to the single crystal semiconductor layer 124 in order to control the threshold voltage of the TFTs. For example, an impurity element such as boron, aluminum, or gallium is added to a region where the n-channel TFT is to be formed, and another impurity element such as phosphorus or arsenic is added to a region where the p-channel TFT is to be formed.

Figure 4D:
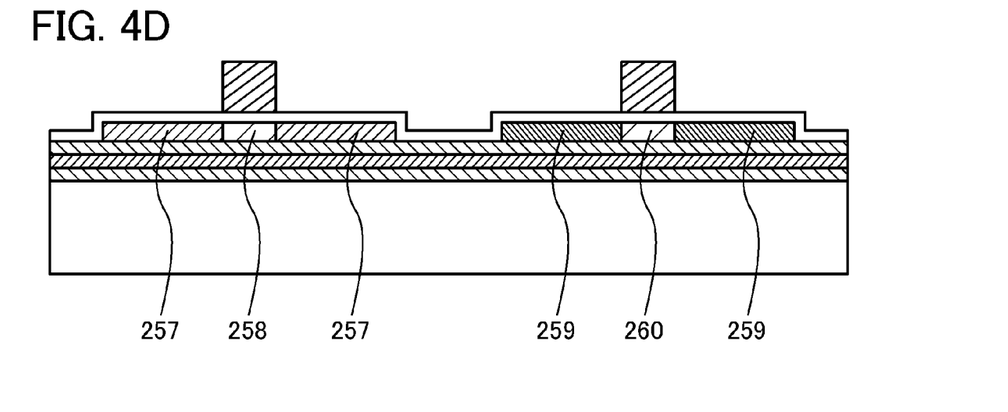

Next, n-type low-concentration impurity regions 257 are formed in the semiconductor layer 251, and p-type high-concentration impurity regions 259 are formed in the semiconductor layer 252 (see FIG. 4D). Specifically, first, the n-type low-concentration impurity regions 257 are formed in the semiconductor layer 251. In order to form the n-type low-concentration impurity regions 257, the semiconductor layer 252 where the p-channel TFT is to be formed is covered with a resist mask, and an impurity element is added to the semiconductor layer 251. As the impurity element, phosphorus or arsenic may be added. When the impurity element is added by an ion doping method or an ion implantation method, the gate electrode 255 serves as a mask, and the n-type low-concentration impurity regions 257 are formed in the semiconductor layer 251 in a self-aligned manner. A region of the semiconductor layer 251 that overlaps with the gate electrode 255 becomes a channel formation region 258.

Next, after the resist mask which covers the semiconductor layer 252 is removed, the semiconductor layer 251 used for the n-channel TFT is covered with a resist mask. Then, an impurity element is added to the semiconductor layer 252 by an ion doping method or an ion implantation method. As the impurity element, boron can be added. In the step of adding the impurity element, the gate electrode 256 serves as a mask, and the p-type high-concentration impurity regions 259 are formed in the semiconductor layer 252 in a self-aligned manner. The high-concentration impurity regions 259 serve as a source region and a drain region. A region of the semiconductor layer 252 that overlaps with the gate electrode 256 becomes a channel formation region 260. Here, the method is described in which the p-type high-concentration impurity regions 259 are formed after the n-type low-concentration impurity regions 257 are formed; however, the p-type high-concentration impurity regions 259 can be formed first.

Figure 5A:
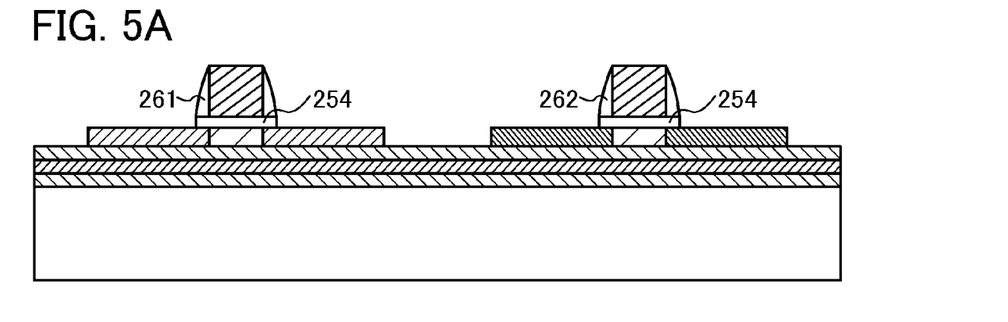
FIGS. 5A to 5C illustrate a manufacturing process of a semiconductor device according to an embodiment.

Next, after the resist that covers the semiconductor layer 251 is removed, an insulating film having a single-layer structure or a layered structure, which includes a nitrogen compound such as silicon nitride or an oxide such as silicon oxide, is formed by a plasma CVD method or the like. This insulating film is anisotropically etched in a perpendicular direction to form sidewall insulating films 261 and 262 which are in contact with side surfaces of the gate electrodes 255 and 256, respectively as illustrated in FIG. 5A. By this anisotropic etching, the insulating film 254 is also etched.

Figure 5B:
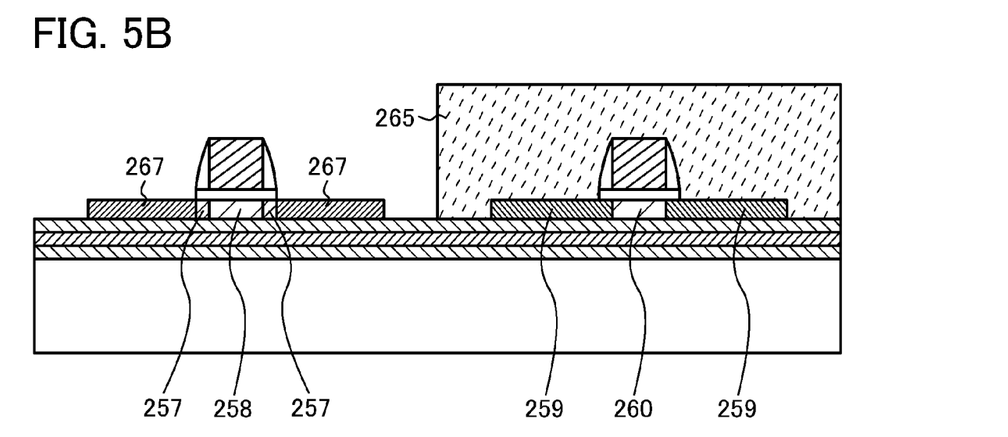

Next, as illustrated in FIG. 5B, the semiconductor layer 252 is covered by a resist 265. In order to form high-concentration impurity regions serving as a source region and a drain region in the semiconductor layer 251, an impurity element is added to the semiconductor layer 251 at high dose by an ion implantation method or an ion doping method. The gate electrode 255 and the sidewall insulating films 261 serve as masks, and n-type high-concentration impurity regions 267 are formed. Next, heat treatment for activation of the impurity element is performed.

Figure 5C:
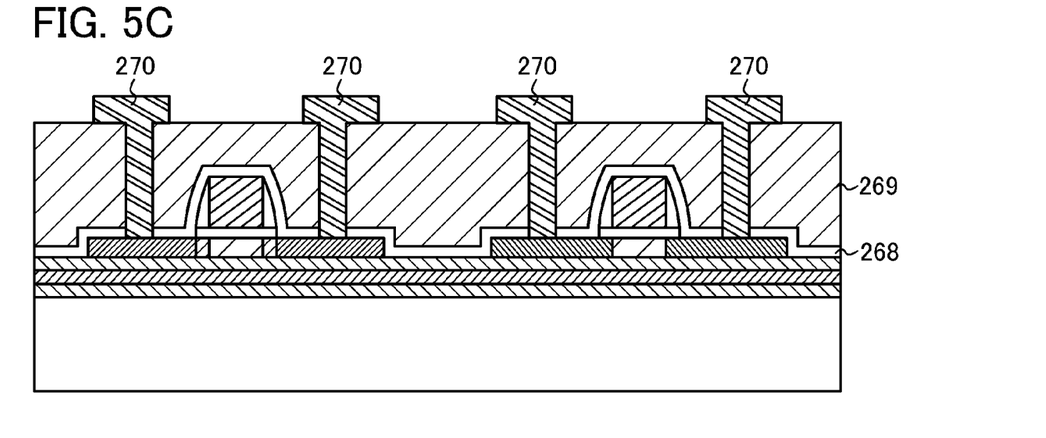

After the heat treatment for activation, an insulating film 268 containing hydrogen is formed as illustrated in FIG. 5C. After the insulating film 268 is formed, heat treatment is performed at a temperature of higher than or equal to 350° C. and lower than or equal to 450° C. so that hydrogen contained in the insulating film 268 is diffused to the semiconductor layers 251 and 252. The insulating film 268 can be formed by deposition of silicon nitride or silicon nitride oxide by a plasma CVD method at a process temperature of lower than or equal to 350° C. By supplying hydrogen to the semiconductor layers 251 and 252, defects serving as trapping centers in the semiconductor layers 251 and 252 and at the interface with the insulating film 254 can be repaired effectively.

After that, an interlayer insulating film 269 is formed. The interlayer insulating film 269 can have a single-layer structure or a layered structure of one or more of films selected from an insulating film containing an inorganic material, such as a silicon oxide film or a BPSG (borophosphosilicate glass) film, and an organic resin film such as a film of polyimide, acrylic, or the like. After contact holes are formed in the interlayer insulating film 269, wirings 270 are formed as illustrated in FIG. 5C. The wirings 270 can be formed with a conductive film with a three-layer structure in which a low-resistance metal film such as an aluminum film or an aluminum-alloy film is sandwiched between barrier metal films, for example. The barrier metal films can be formed using metal films of molybdenum, chromium, titanium, and the like.

Through the above steps, a semiconductor device including the n-channel TFT and the p-channel TFT can be manufactured over a glass substrate or the like at low heat treatment temperature by using a semiconductor film with a small number of crystal defects.

This embodiment can be combined with any of the other embodiments in this specification as appropriate.

This application is based on Japanese Patent Application serial no. 2010-176013 filed with Japan Patent Office on Aug. 5, 2010, the entire contents of which are hereby incorporated by reference.

What is claimed is:

1. A method for manufacturing an SOI substrate, comprising the steps of:
    forming an oxide film on a surface of a semiconductor substrate;
    forming a silicon nitride film over the oxide film;
    forming an embrittled region by irradiating the semiconductor substrate with hydrogen ions from one surface side of the semiconductor substrate through the silicon nitride film;
    performing a heat treatment to supply hydrogen from the silicon nitride film toward the embrittled region;
    after performing the heat treatment, bonding the semiconductor substrate in which the embrittled region is formed to a base substrate with the silicon nitride film interposed therebetween; and after performing the heat treatment, forming a semiconductor layer over the base substrate by separating the semiconductor substrate along the embrittled region, wherein the silicon nitride film comprises hydrogen in a concentration of greater than or equal to an irradiation amount of the hydrogen ions added into the semiconductor substrate.

2. The method for manufacturing an SOI substrate according to claim 1, wherein the hydrogen ions comprise $H_3^+$ ion.

3. The method for manufacturing an SOI substrate according to claim 1, wherein the semiconductor substrate is separated along the embrittled region by heating the semiconductor substrate.

4. The method for manufacturing an SOI substrate according to claim 3, wherein the semiconductor substrate is heated at a temperature higher than or equal to 550° C. and lower than or equal to 730° C.

5. The method for manufacturing an SOI substrate according to claim 1, wherein the silicon nitride film comprises oxygen.

6. The method for manufacturing an SOI substrate according to claim 1, further comprising the step of forming a bond layer over the base substrate, wherein the semiconductor substrate and the base substrate are bonded to each other by directly attaching the silicon nitride film and the bond layer to each other.

7. A method for manufacturing an SOI substrate, comprising the steps of:
forming an oxide film on a surface of a semiconductor substrate;
forming an embrittled region by irradiating the semiconductor substrate with hydrogen ions from one surface side of the semiconductor substrate;
forming a silicon nitride film over the one surface of the semiconductor substrate after forming the embrittled region;
performing a heat treatment to supply hydrogen from the silicon nitride film toward the embrittled region;
after performing the heat treatment, bonding the semiconductor substrate in which the embrittled region is formed to a base substrate with the silicon nitride film interposed therebetween; and
after performing the heat treatment, forming a semiconductor layer over the base substrate by separating the semiconductor substrate along the embrittled region,
wherein the silicon nitride film comprises hydrogen in a concentration of greater than or equal to an irradiation amount of the hydrogen ions added into the semiconductor substrate.

8. The method for manufacturing an SOI substrate according to claim 7, wherein the irradiation amount of the hydrogen ions is greater than or equal to $5\times10^{20}$ atoms/cm$^3$ and less than or equal to $3\times10^{21}$ atoms/cm$^3$.

9. The method for manufacturing an SOI substrate according to claim 7, wherein the hydrogen ions comprise $H_3^+$ ion.

10. The method for manufacturing an SOI substrate according to claim 7, wherein the semiconductor substrate is separated along the embrittled region by heating the semiconductor substrate.

11. The method for manufacturing an SOI substrate according to claim 10, wherein the semiconductor substrate is heated at a temperature higher than or equal to 550° C. and lower than or equal to 730° C.

12. The method for manufacturing an SOI substrate according to claim 7, wherein the silicon nitride film comprises oxygen.

13. The method for manufacturing an SOI substrate according to claim 7, further comprising the step of forming a bond layer over the base substrate, wherein the semiconductor substrate and the base substrate are bonded to each other by directly attaching the silicon nitride film and the bond layer to each other.

14. A method for manufacturing an SOI substrate, comprising the steps of:
forming an oxide film on a surface of a semiconductor substrate;
forming a silicon nitride film over the oxide film;
forming an embrittled region by irradiating the semiconductor substrate with hydrogen ions from one surface side of the semiconductor substrate through the silicon nitride film;
performing a heat treatment to supply hydrogen from the silicon nitride film toward the embrittled region;
after performing the heat treatment, bonding the semiconductor substrate in which the embrittled region is formed to a base substrate with the silicon nitride film interposed therebetween; and
after performing the heat treatment, forming a semiconductor layer over the base substrate by separating the semiconductor substrate along the embrittled region,
wherein the silicon nitride film comprises hydrogen in a concentration of greater than or equal to an irradiation amount of the hydrogen ions added into the semiconductor substrate, and
wherein the irradiation amount of the hydrogen ions is greater than or equal to $5\times10^{20}$ atoms/cm$^3$ and less than or equal to $3\times10^{21}$ atoms/cm$^3$.

15. The method for manufacturing an SOI substrate according to claim 14, wherein the hydrogen ions comprise $H_3^+$ ion.

16. The method for manufacturing an SOI substrate according to claim 14, wherein the semiconductor substrate is separated along the embrittled region by heating the semiconductor substrate.

17. The method for manufacturing an SOI substrate according to claim 16, wherein the semiconductor substrate is heated at a temperature higher than or equal to 550° C. and lower than or equal to 730° C.

18. The method for manufacturing an SOI substrate according to claim 14, wherein the silicon nitride film comprises oxygen.

19. The method for manufacturing an SOI substrate according to claim 14, further comprising the step of forming a bond layer over the base substrate, wherein the semiconductor substrate and the base substrate are bonded to each other by directly attaching the silicon nitride film and the bond layer with each other.

20. The method for manufacturing an SOI substrate according to claim 1, wherein the heat treatment is performed at a temperature lower than 400° C.

21. The method for manufacturing an SOI substrate according to claim 7, wherein the heat treatment is performed at a temperature lower than 400° C.

22. The method for manufacturing an SOI substrate according to claim 14, wherein the heat treatment is performed at a temperature lower than 400° C.

* * * * *